US007247532B2

United States Patent
Ju

(10) Patent No.: US 7,247,532 B2
(45) Date of Patent: Jul. 24, 2007

(54) HIGH VOLTAGE TRANSISTOR AND METHOD FOR FABRICATING THE SAME

(75) Inventor: Jae-Il Ju, Chungcheongbuk-do (KR)

(73) Assignee: Magnachip Semiconductor, Ltd. (KR)

( * ) Notice: Subject to any disclaimer, the term of this patent is extended or adjusted under 35 U.S.C. 154(b) by 85 days.

(21) Appl. No.: 11/223,413

(22) Filed: Sep. 8, 2005

(65) Prior Publication Data
US 2006/0049462 A1    Mar. 9, 2006

(30) Foreign Application Priority Data
Sep. 8, 2004    (KR)    .................... 10-2004-0071818

(51) Int. Cl.
*H01L 21/8238*    (2006.01)
(52) U.S. Cl. ...................... 438/199; 438/202; 438/203; 257/341; 257/404; 257/E21.633
(58) Field of Classification Search ............... 438/142, 438/197, 236, 199, 200, 206, 209, 234, 202, 438/203; 257/288, 409, 355, 500, E21.633, 257/341, 401
See application file for complete search history.

(56) References Cited

U.S. PATENT DOCUMENTS 4,814,288 A * 3/1989 Kimura et al. .............. 438/206

* cited by examiner

*Primary Examiner*—Brook Kebede
*Assistant Examiner*—Ankush Singal
(74) *Attorney, Agent, or Firm*—Blakely Sokoloff Taylor & Zafman

(57) ABSTRACT

A high voltage transistor operating through a high voltage and a method for fabricating the same are provided. The high voltage transistor includes: an insulation layer on a substrate; an $N^+$-type drain junction region on the insulation layer; an $N^-$-type drain junction region on the $N^+$-type drain junction region; a $P^-$-type body region provided in a trench region of the $N^-$-type drain junction region; a plurality of gate patterns including a gate insulation layer and a gate conductive layer in other trench regions bordered by the $P^-$-type body region and the $N^-$-type drain junction region; a plurality of source regions contacted to a source electrode on the $P^-$-type body region; and a plurality of $N^+$-type drain regions contacted to the $N^-$-type drain junction region and individual drain electrodes.

10 Claims, 21 Drawing Sheets

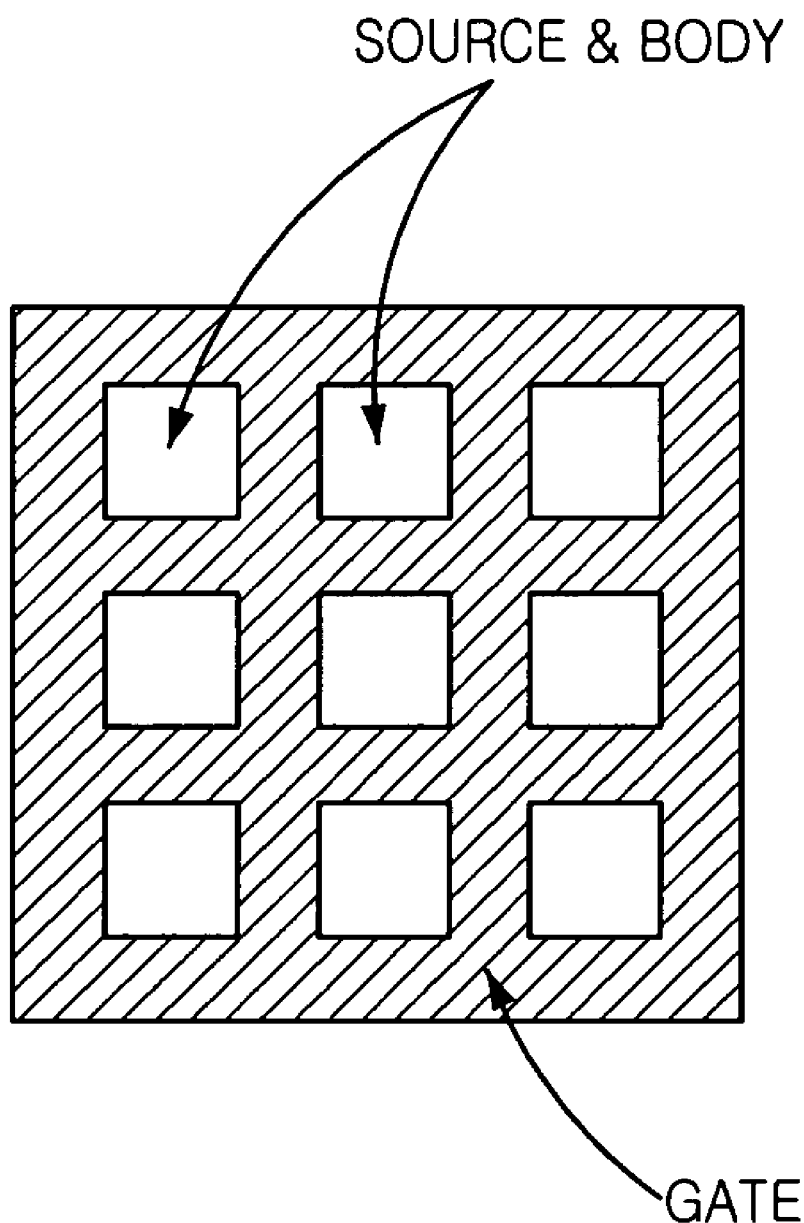

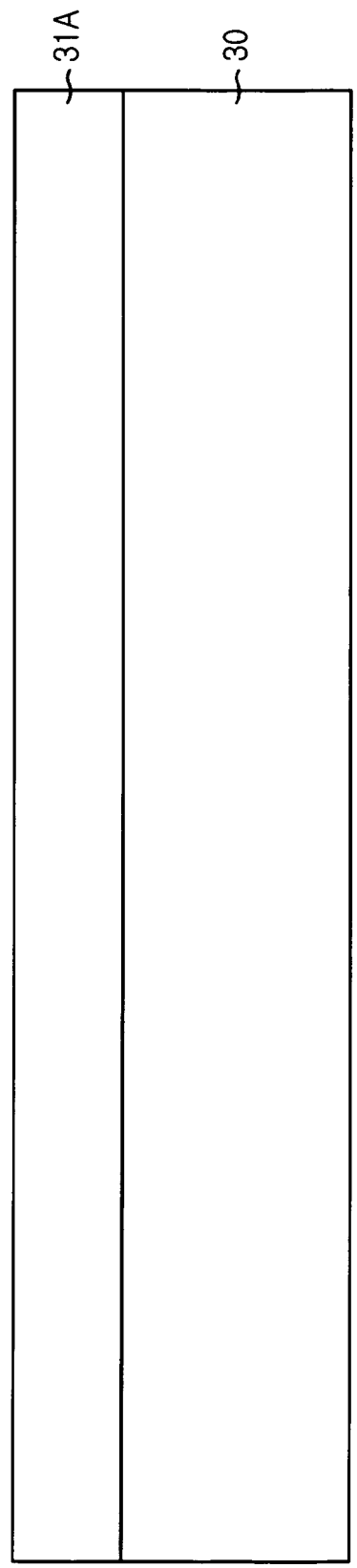

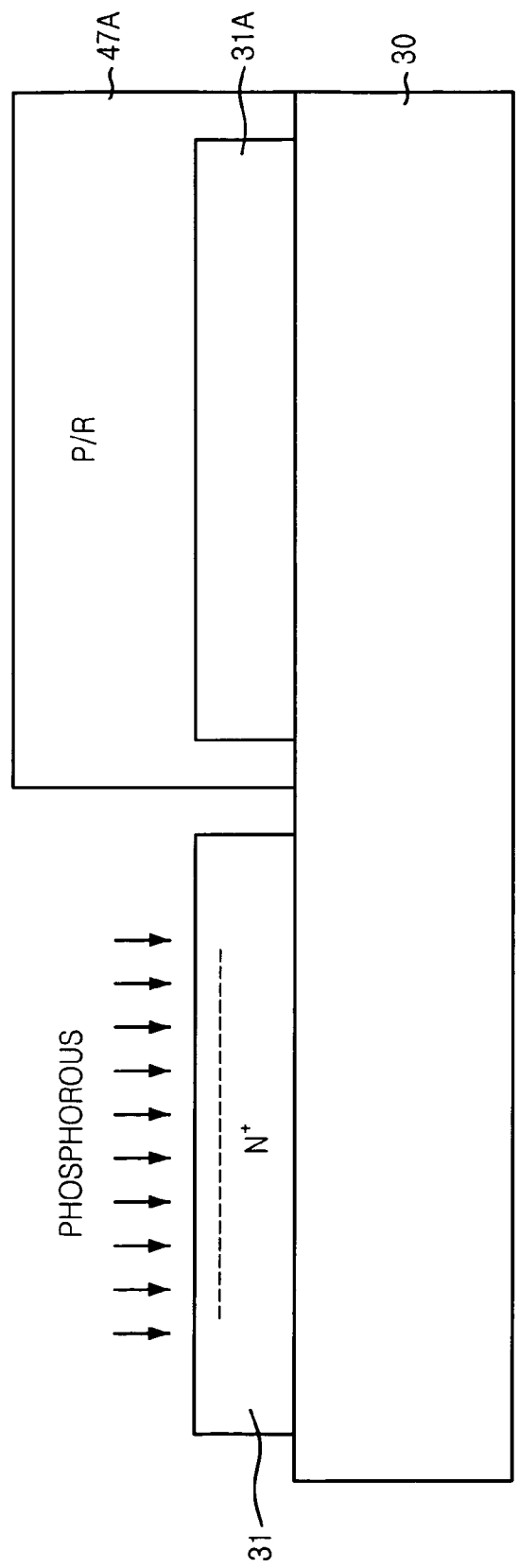

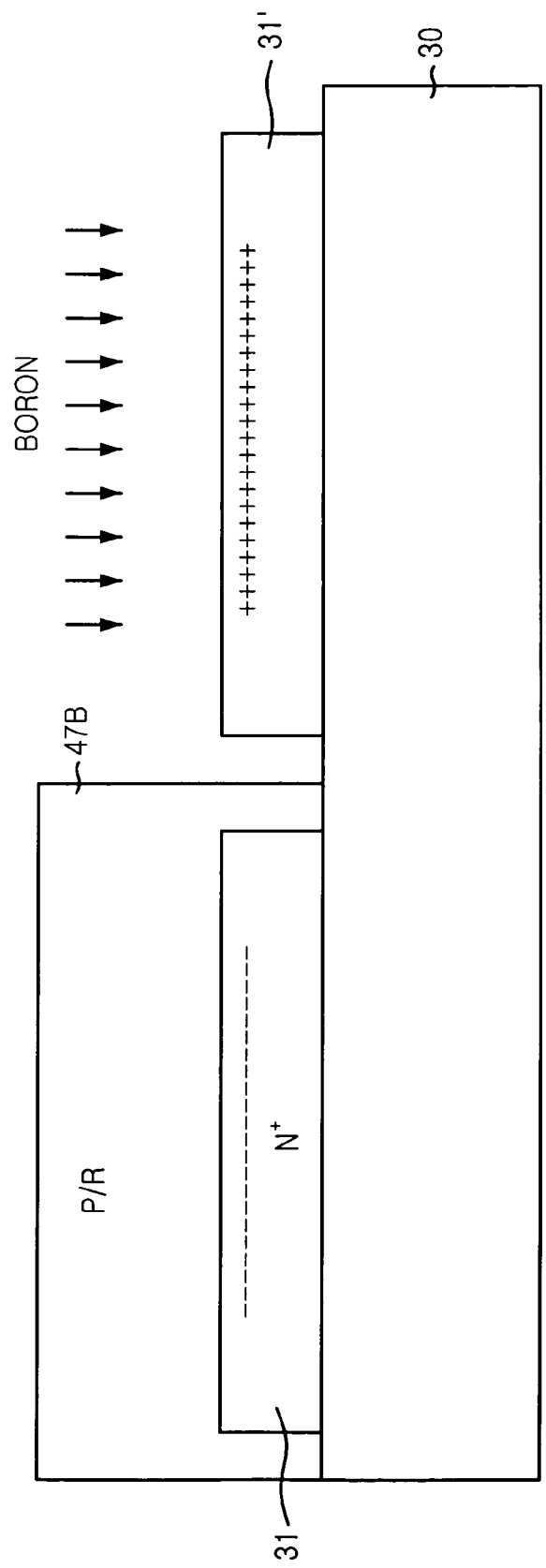

HIGH VOLTAGE TRANSISTOR AND METHOD FOR FABRICATING THE SAME

FIELD OF THE INVENTION

The present invention relates to a semiconductor integration circuit; and more particularly, to a high voltage transistor operating through a high voltage and a method for fabricating the same.

DESCRIPTION OF RELATED ARTS

A highly doped source/drain region and a lowly doped drift region are formed and used for a typical high voltage transistor to improve an avalanche break down voltage.

FIG. 1 is a top view illustrating a conventional high voltage transistor.

As for the conventional high voltage transistor illustrated in FIG. 1, a plurality of source and body electrodes individually having rectangular shapes and a gate electrode surrounding the respective source and body electrodes are provided.

FIGS. 2A and 2B are cross-sectional views illustrating different types of the conventional high voltage transistor shown in FIG. 1. Especially, FIG. 2A illustrates an N-channel metal oxide semiconductor (NMOS) transistor, and FIG. 2B illustrates a conventional P-channel metal oxide semiconductor (PMOS) transistor.

With reference to FIG. 2A, a drain electrode 18, a drain region 10, an $N^-$-type drain junction region 11 formed with an epitaxial layer and a plurality of $P^-$-type body regions 12 are sequentially formed from the bottom.

A plurality of source regions 14 and a source contact region 15 are formed between a plurality of gate electrodes 17 buried down into the $P^-$-type body regions 12 through the source regions.

The PMOS transistor illustrated in FIG. 2B includes the same device elements but doped with an inverse impurity type. For instance, a reference numeral 11' denotes a $P^-$-type drain junction region in the PMOS transistor.

The conventional high voltage transistor should be formed by using a single layered silicon substrate or an epitaxial wafer.

Accordingly, it is considered difficult to fabricate the conventional high voltage transistor to be built in an integration circuit and also, the conventional high voltage transistor is generally embodied only through separate devices.

SUMMARY OF THE INVENTION

It is, therefore, an object of the present invention to provide a high voltage transistor that can be integrated into an integration circuit by using a typical silicon substrate and a method for fabricating the same.

In accordance with an aspect of the present invention, there is provided a high voltage transistor, including: an insulation layer on a substrate; an $N^+$-type drain junction region on the insulation layer; an $N^-$-type drain junction region on the $N^+$-type drain junction region; a $P^-$-type body region provided in a trench region of the $N^-$-type drain junction region; a plurality of gate patterns including a gate insulation layer and a gate conductive layer in other trench regions bordered by the $P^-$-type body region and the $N^-$-type drain junction region; a plurality of source regions contacted to a source electrode on the $P^-$-type body region; and a plurality of $N^+$-type drain regions contacted to the $N^-$-type drain junction region and individual drain electrodes.

In accordance with another aspect of the present invention, there is provided a high voltage transistor, including: an insulation layer on a substrate; a $P^+$-type drain junction region on the insulation layer; a $P^-$-type drain junction region on the $P^+$-type drain junction region; an $N^-$-type body region provided in a trench region inside of the $P^-$-type drain junction region; a plurality of gate patterns including a gate insulation layer and a gate conductive layer in other trench regions bordered by the $N^-$-type body region and the $P^-$-type drain junction region; a plurality of source regions contacted to a source region on the $N^-$-type body region; and a plurality of $P^+$-type drain regions contacted to the $P^-$-type drain junction region and individual drain electrodes.

In accordance with further aspect of the present invention, there is provided a method for fabricating a high voltage transistor, including: preparing a substrate including an insulation layer and a silicon layer formed on the insulation layer; patterning the silicon layer to definite a transistor region; forming a highly concentrated drain junction region of a first conductive type by implanting a first conductive type impurity to the transistor region; forming a drain junction region of the first conductive type on the highly concentrated drain junction region of the first conductive type by growing an epitaxial layer of the first conductive type; forming a body region of a second conductive type in a predetermined portion of the drain junction region of the first conductive type; forming a plurality of gate patterns in other predetermined portions of the drain junction region bordered by the body region of the second conductive type and the drain junction region of the first conductive type; and forming a plurality of highly concentrated drain regions of the first conductive type and a plurality of highly concentrated source regions of the first conductive type by implanting the first conductive type impurity to the drain junction region of the first conductive type and the body region of the second conductive type.

BRIEF DESCRIPTION OF THE DRAWINGS

The above and other objects and features of the present invention will become better understood with respect to the following description of the specific embodiments given in conjunction with the accompanying drawings, in which:

FIG. 1 is a top view illustrating a conventional high voltage transistor;

DETAILED DESCRIPTION OF THE INVENTION

Hereinafter, detailed descriptions of certain embodiments of the present invention will be provided with reference to the accompanying drawings.

Figure 2A:
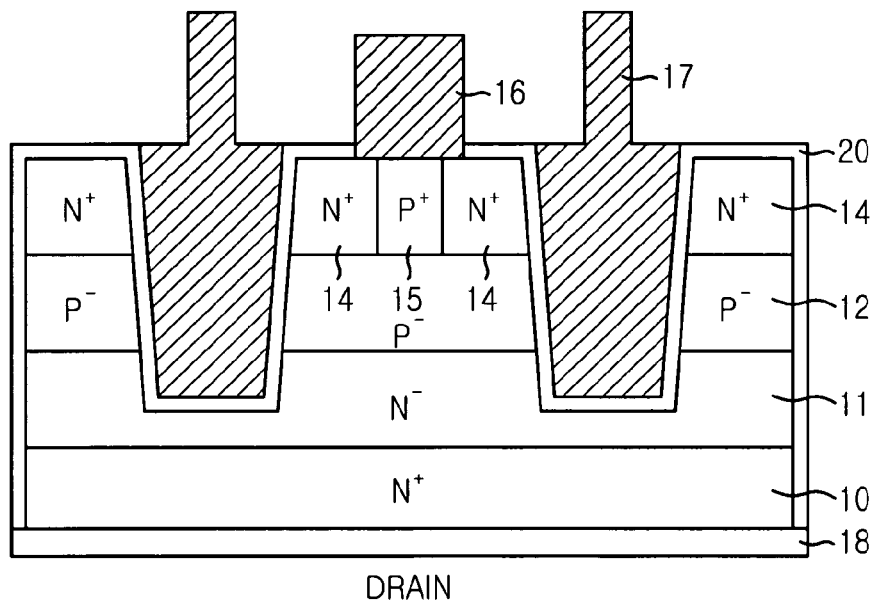
FIGS. 2A and 2B are cross-sectional views illustrating different types of the conventional high voltage transistor shown in FIG. 1.
Figure 2B:
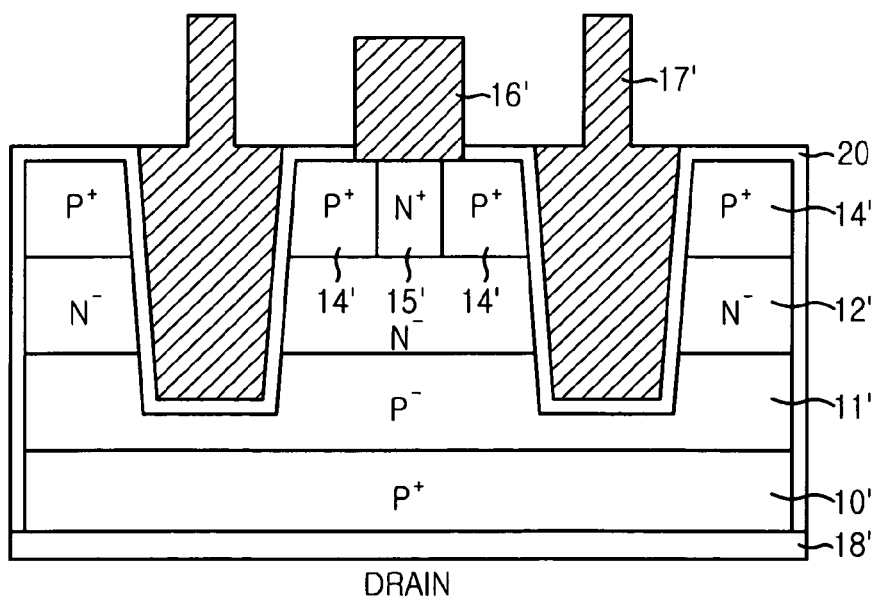
Figure 3:
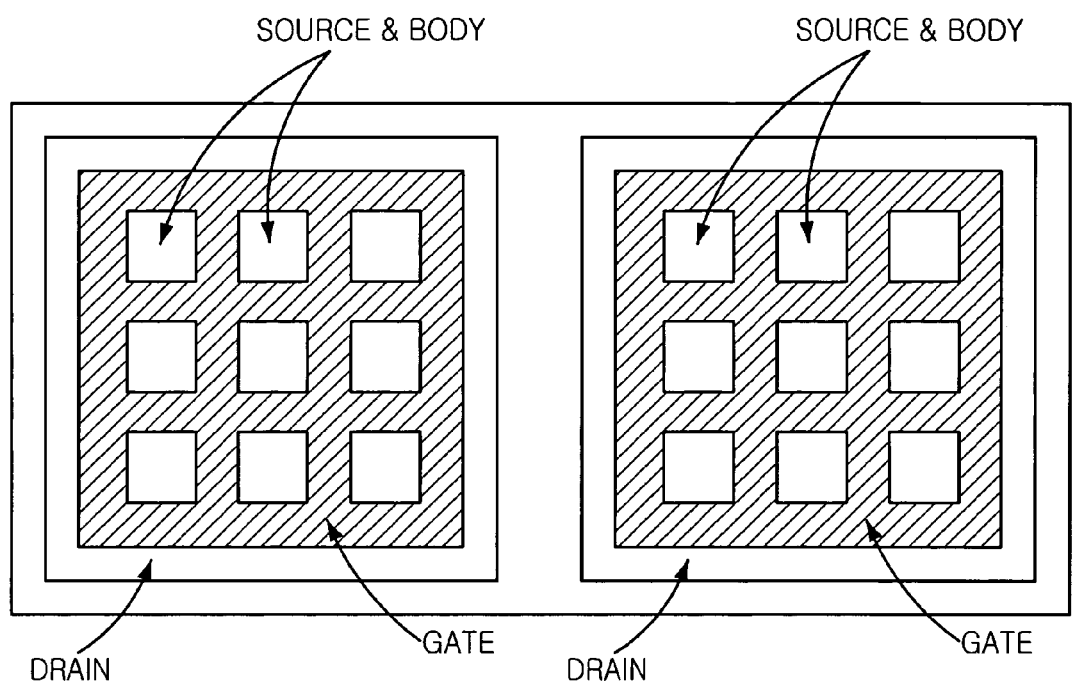
FIG. 3 is a top view illustrating a high voltage transistor in accordance with a specific embodiment of the present invention.

FIG. 3 is a top view illustrating a high voltage transistor in accordance with a specific embodiment of the present invention.

Referring to FIG. 3, the high voltage transistor provides a characteristic that the high voltage transistor is formed on a front side, not a back side, of a substrate which is a drain electrode. The high voltage transistor includes a plurality of rectangular source and body regions placed into all directions, a gate electrode surrounding the plurality of source and body regions and a drain region surrounding the outside of the electrode gate.

Figure 4:
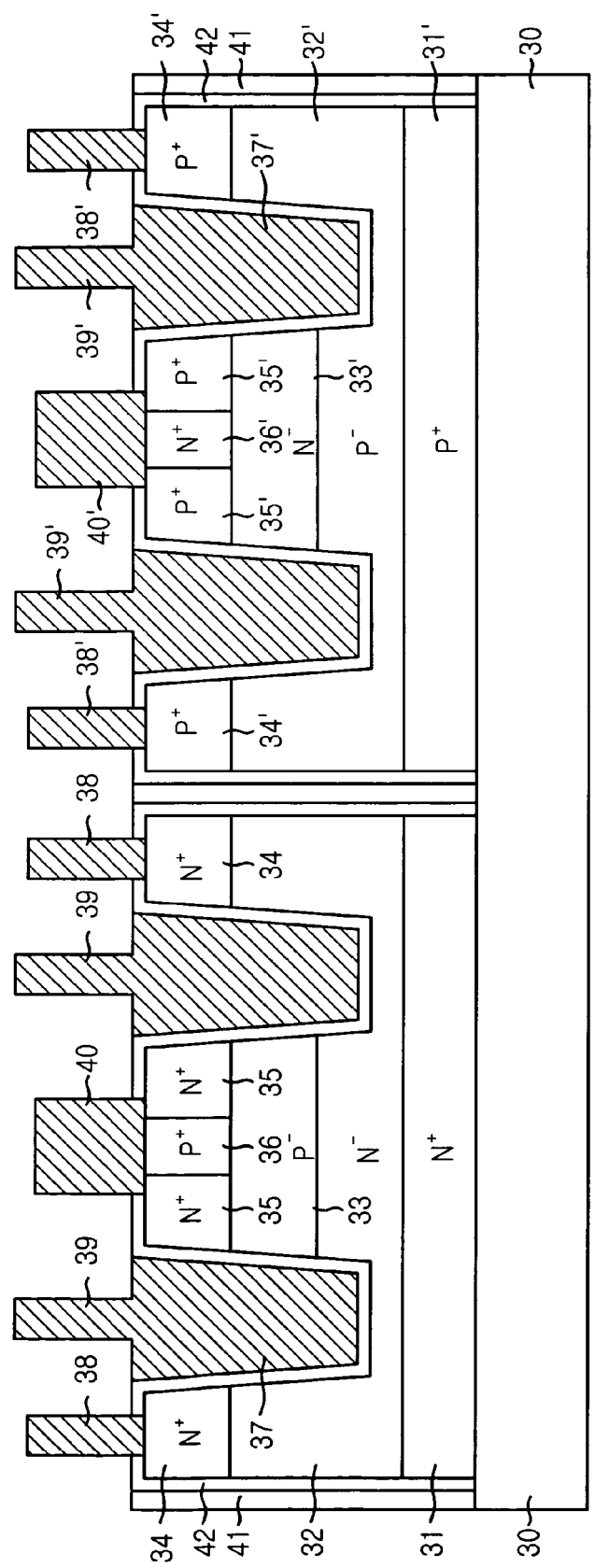
FIG. 4 is a cross-sectional view illustrating a high voltage transistor in accordance with the specific embodiment of the present invention.

FIG. 4 is a cross-sectional view illustrating different types of a high voltage transistor in accordance with the specific embodiment of the present invention.

First, a high voltage N-channel metal oxide semiconductor (NMOS) will be examined. An $N^+$-type drain junction region 31 and $N^-$-type drain junction region 32 are sequentially formed on an insulation layer 30 formed on a substrate. Then, a $P^-$-type body region 33 is formed in a trench region inside of the $N^-$-type drain junction region 32 and a plurality of gate patterns formed by stacking a gate insulation layer 42 and a gate conductive layer 37 are formed in other trench regions bordered by the $P^-$-type body region 33 and the $N^-$-type drain junction region 32.

Furthermore, a plurality of source regions 35 and 36 contacted to a source electrode 40 is formed on the $P^-$-type body region 33, and a plurality of $N^+$-type drain regions 34 contacted to the $N^-$-type drain junction region 32 in a downward direction and to individual drain electrodes 38 in an upward direction are formed. Herein, reference numerals 39 denote a plurality of gate electrodes.

In more details of the source regions 35 and 36, the source regions include: a $P^+$-type source contact region 36 contacted to the source electrode 40; and the plurality of $N^+$-type source regions 35 formed in a manner to surround the $P^+$-type source contact region 36.

Hereinafter, a high voltage P-channel metal oxide semiconductor (PMOS) will be examined. A $P^+$-type drain junction region 31' and a $P^-$-type drain junction region 32' are sequentially formed on the insulation layer 30 provided with the substrate. An $N^-$-type body region 33' is formed in a trench region inside of the $P^-$-type drain junction region 32' and a plurality of gate patterns formed by stacking a gate insulation layer 42 and a gate conductive layer 37' are formed in other trench regions bordered by the $N^-$-type body region 33' and the $P^-$-type drain junction region 32'.

Furthermore, a plurality of source regions 35' and 36' contacted to a source electrode 40' are formed on the $N^-$-type body region 33', and a plurality of $P^+$-type drain regions 34' contacted to the $P^-$-type drain junction region 32' in a downward direction and to individual drain electrodes 38' in an upward direction are formed. Herein, reference numerals 39' denote a plurality of gate electrodes.

In more detail of the source regions 35' and 36', the source regions include: a $N^+$-type source contact region 36' contacted to a source electrode 40' in a upward direction; and the plurality of $P^+$-type source regions 35' formed in a manner to surround the $N^+$-type source contact region 36'.

Figure 5B:
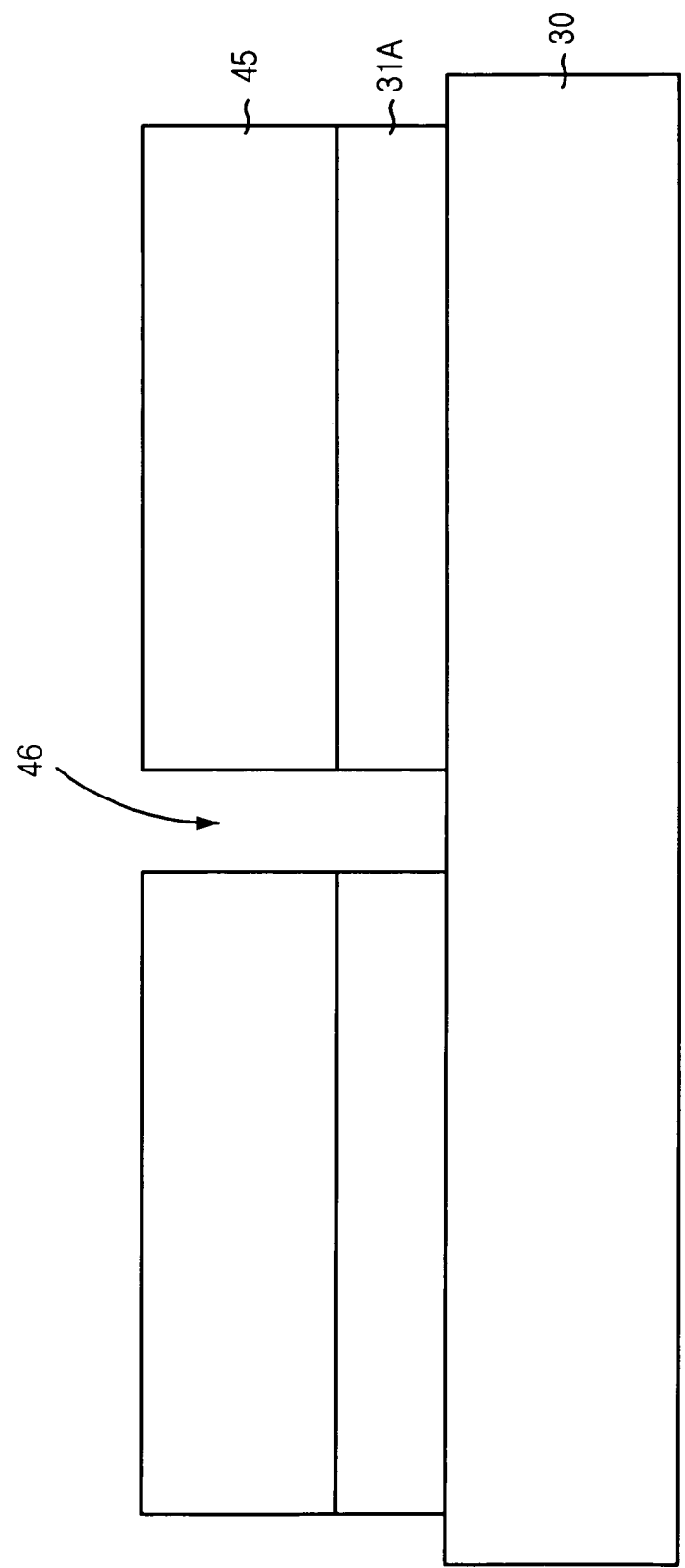
FIGS. 5A to 5Q are cross-sectional views illustrating a method for fabricating the high voltage transistor shown in FIG. 4.
Figure 5E:
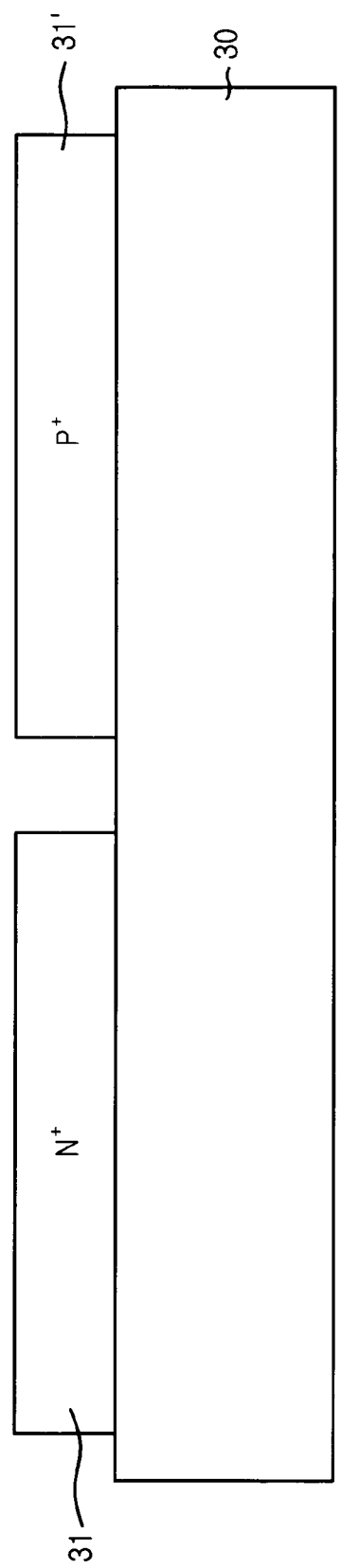
Figure 5F:
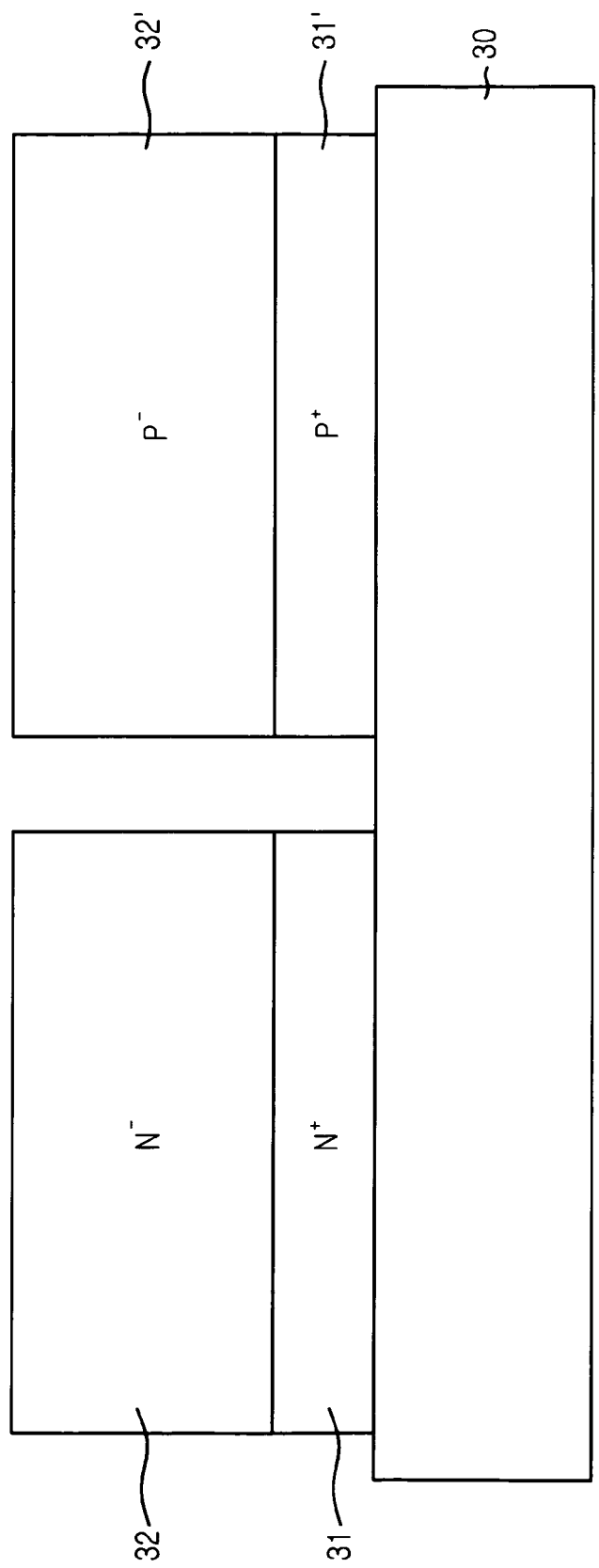
Figure 5G:
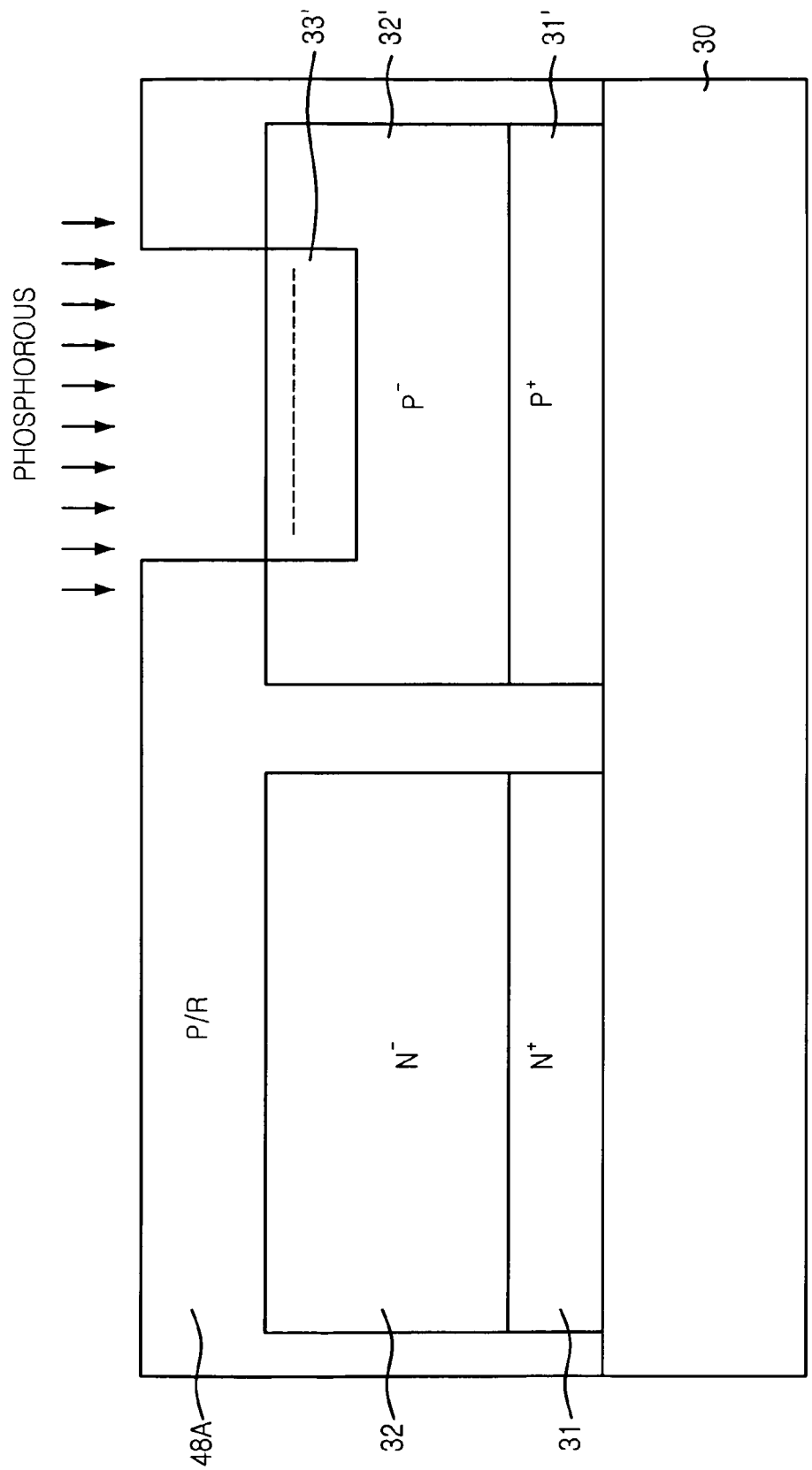
Figure 5H:
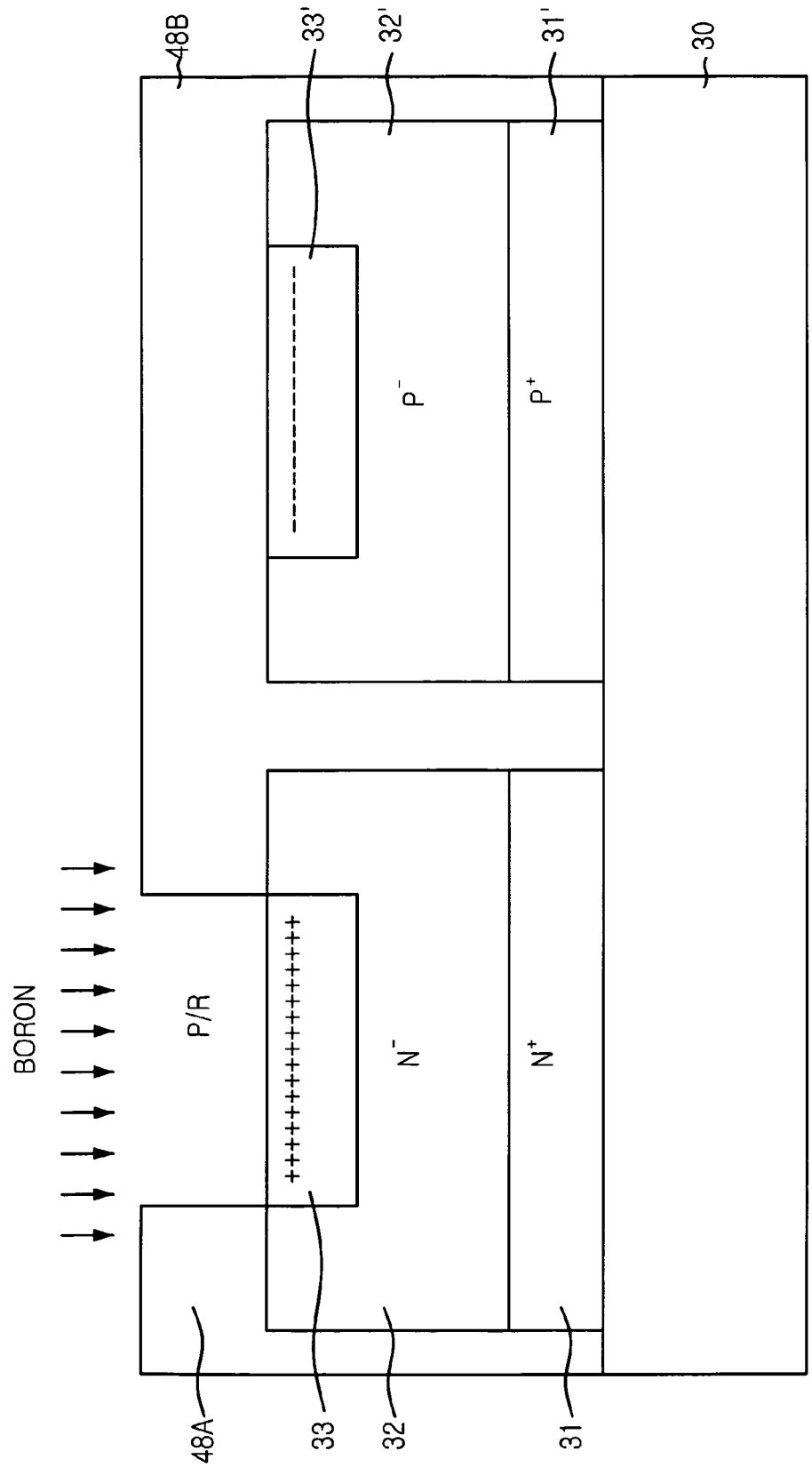
Figure 5I:
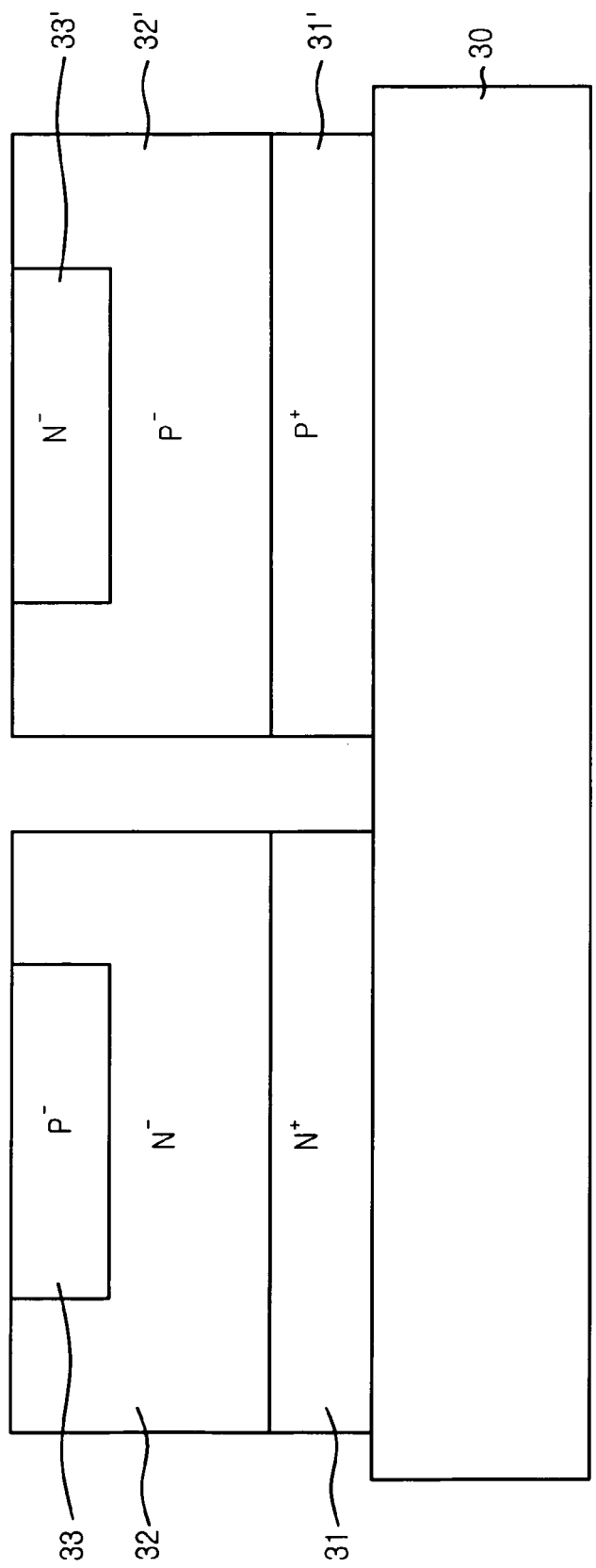
Figure 5J:
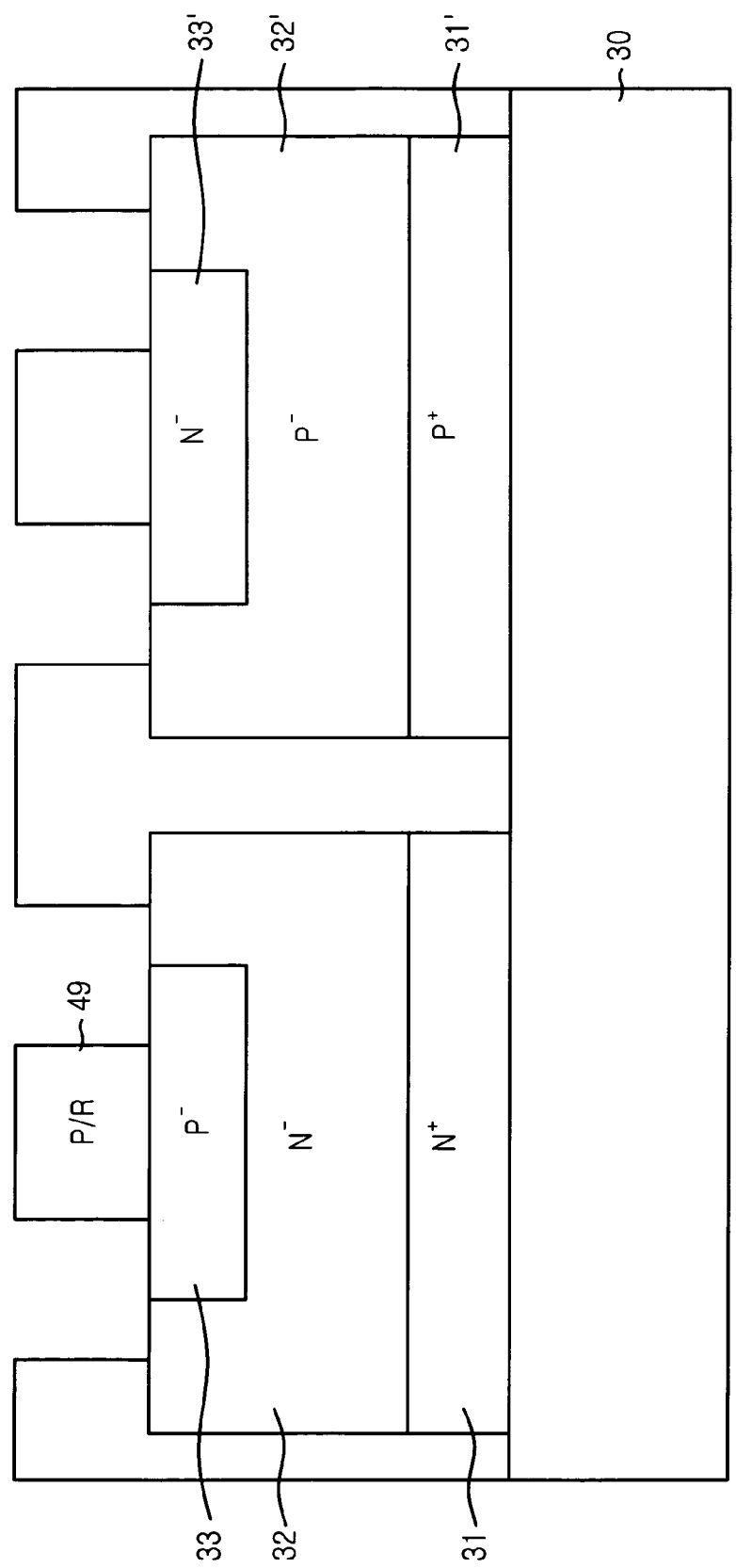
Figure 5K:
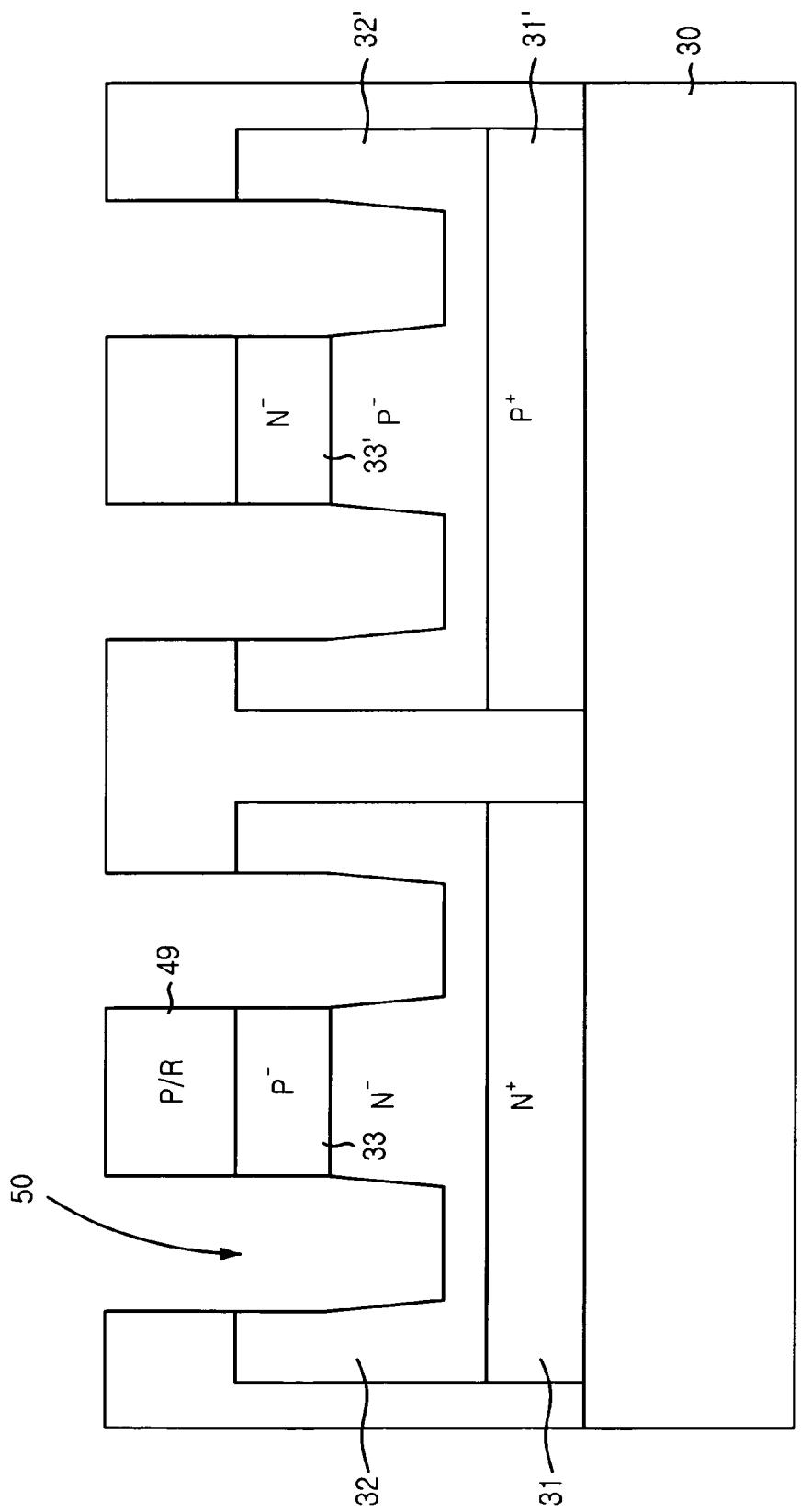
Figure 5L:
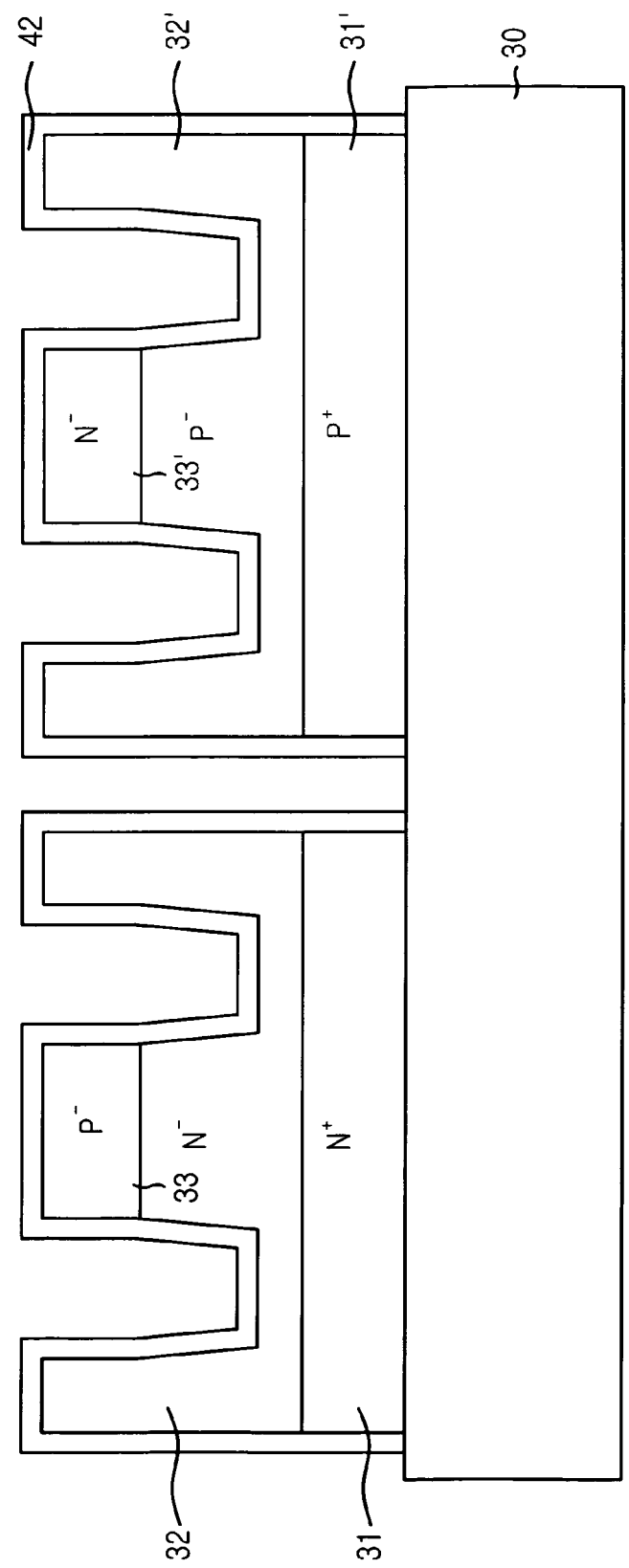
Figure 5M:
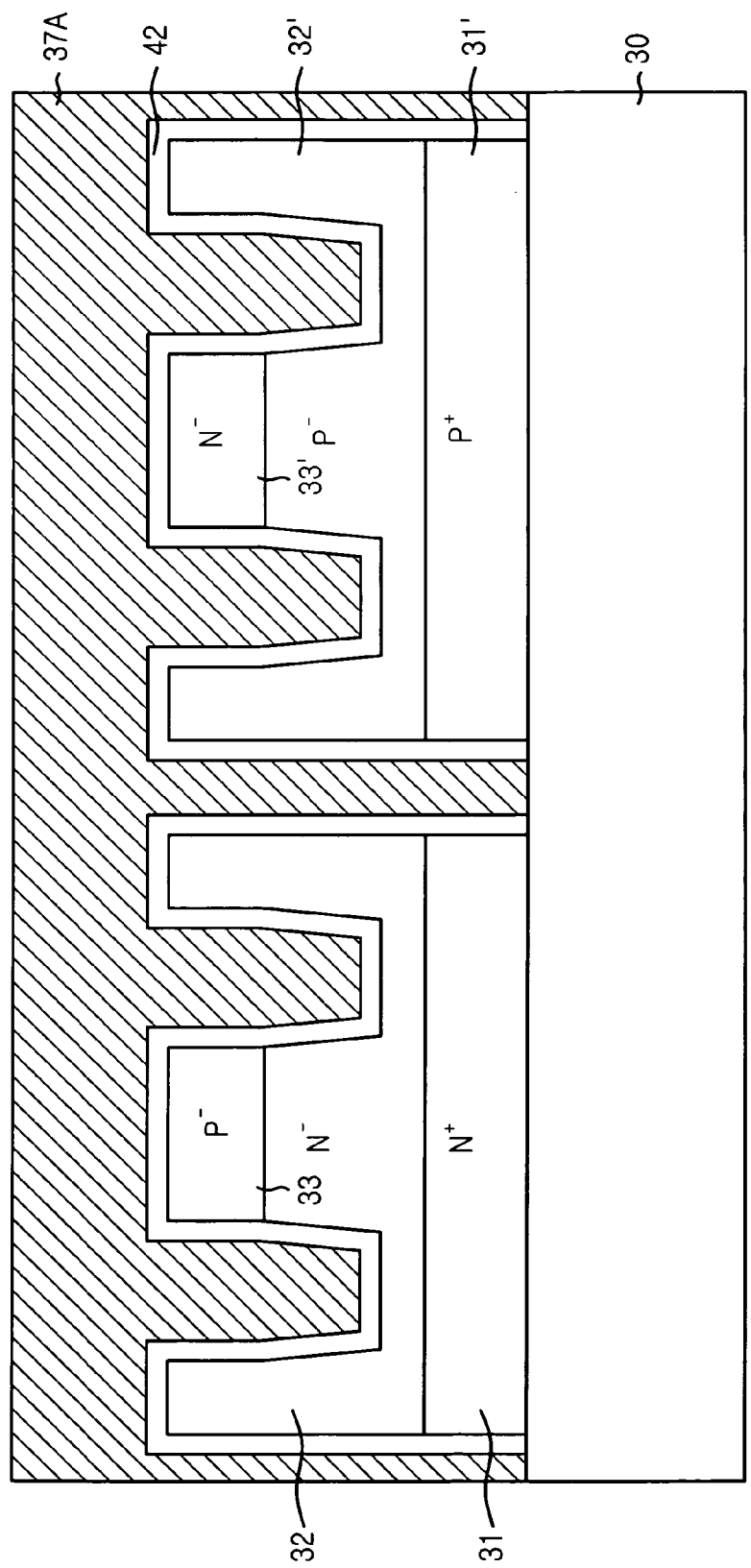
Figure 5N:
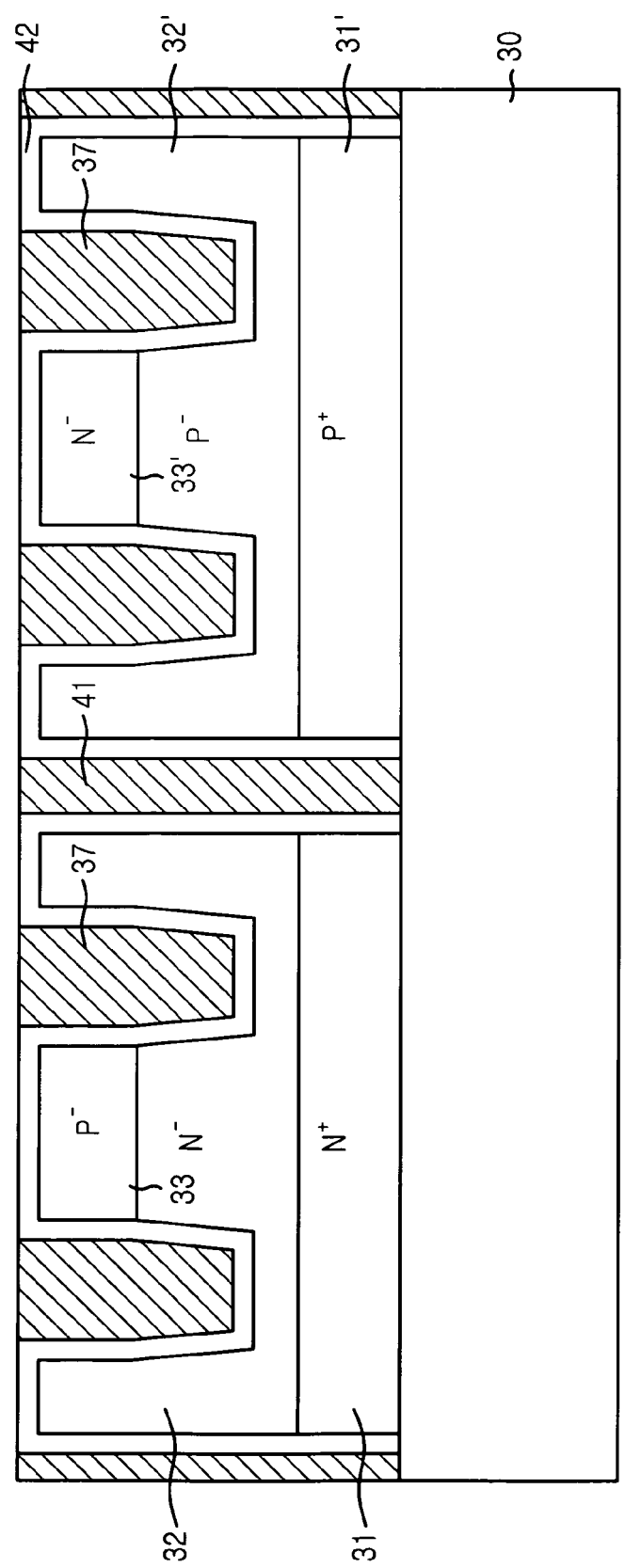
Figure 50:
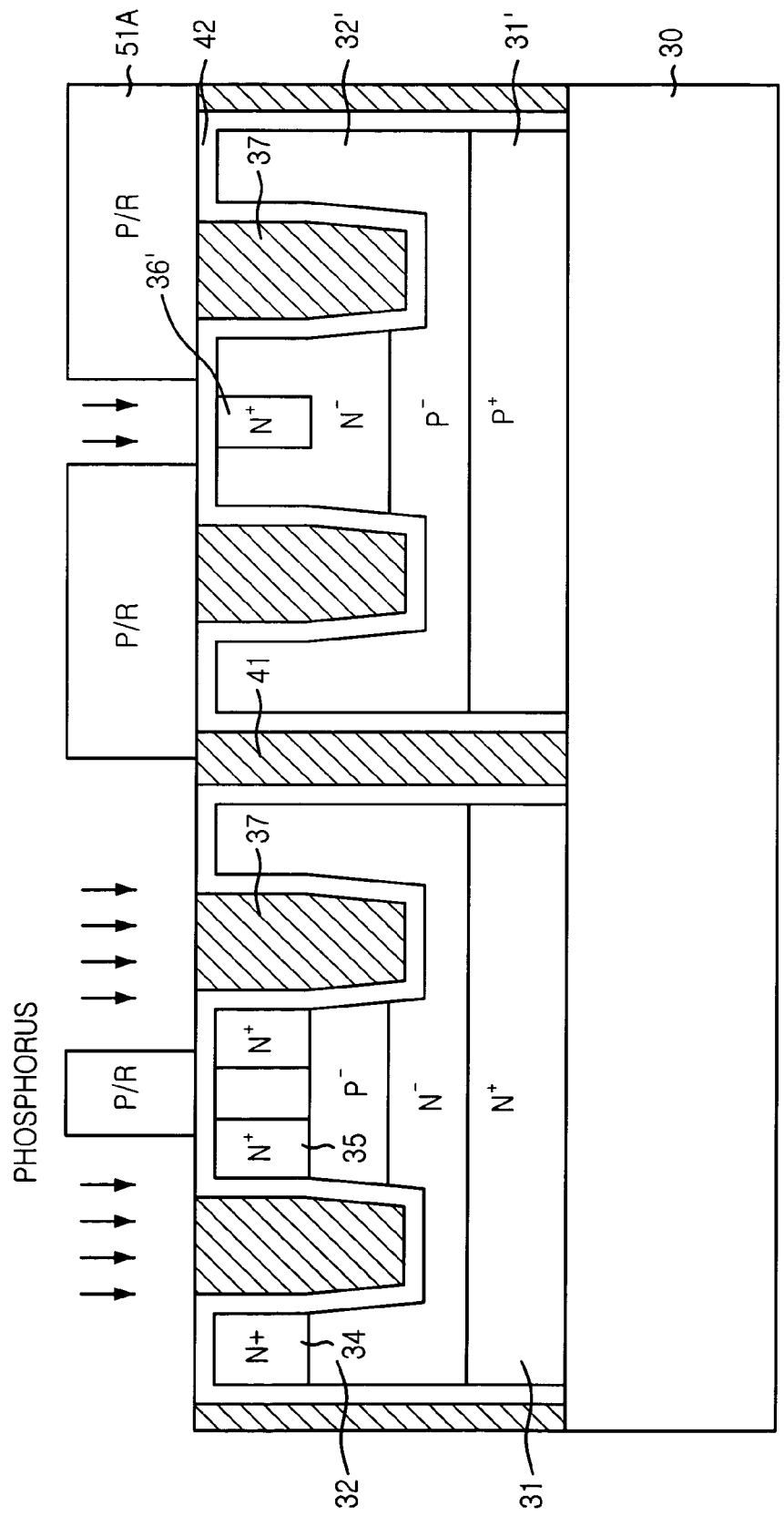
Figure 5P:
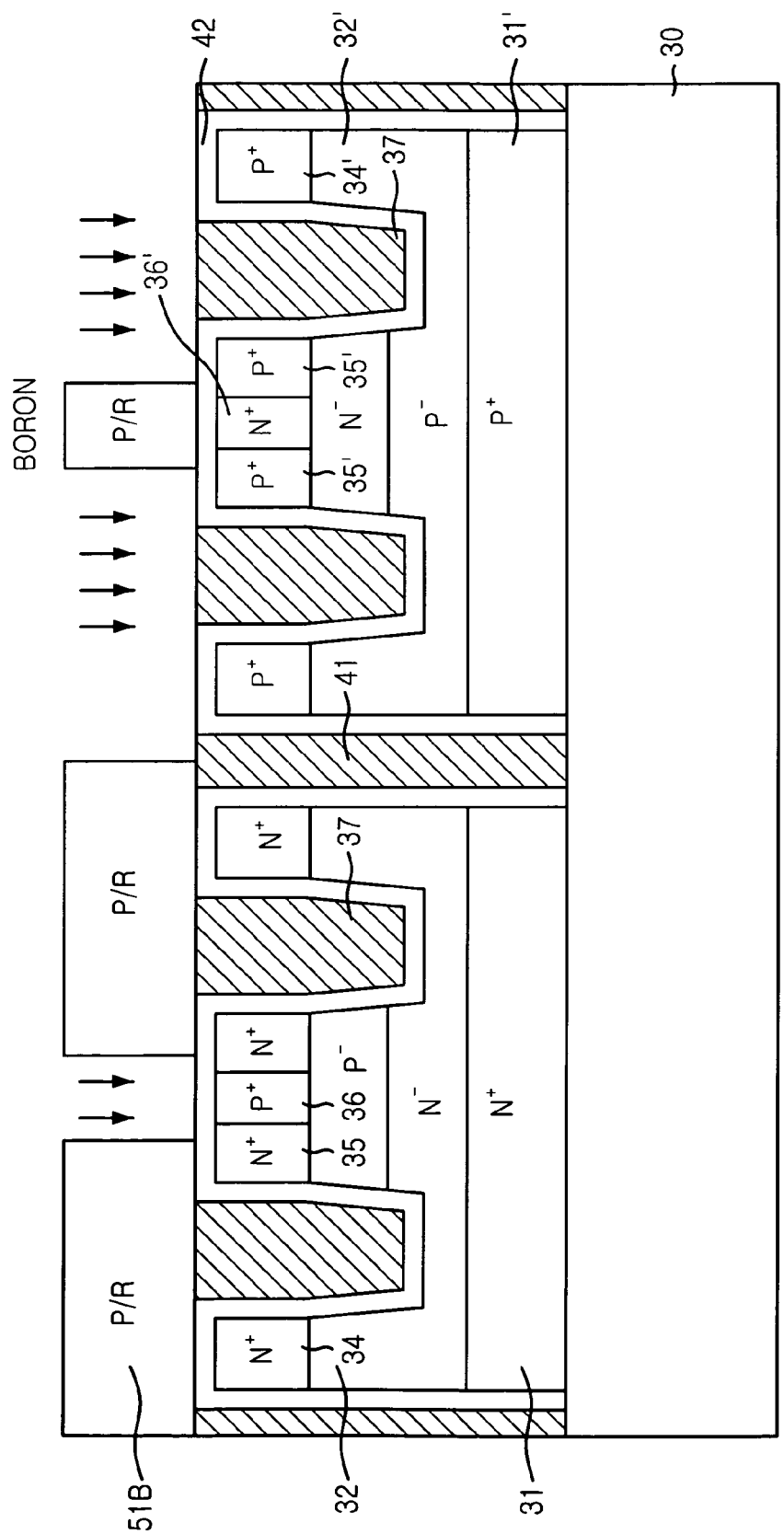
Figure 5Q:
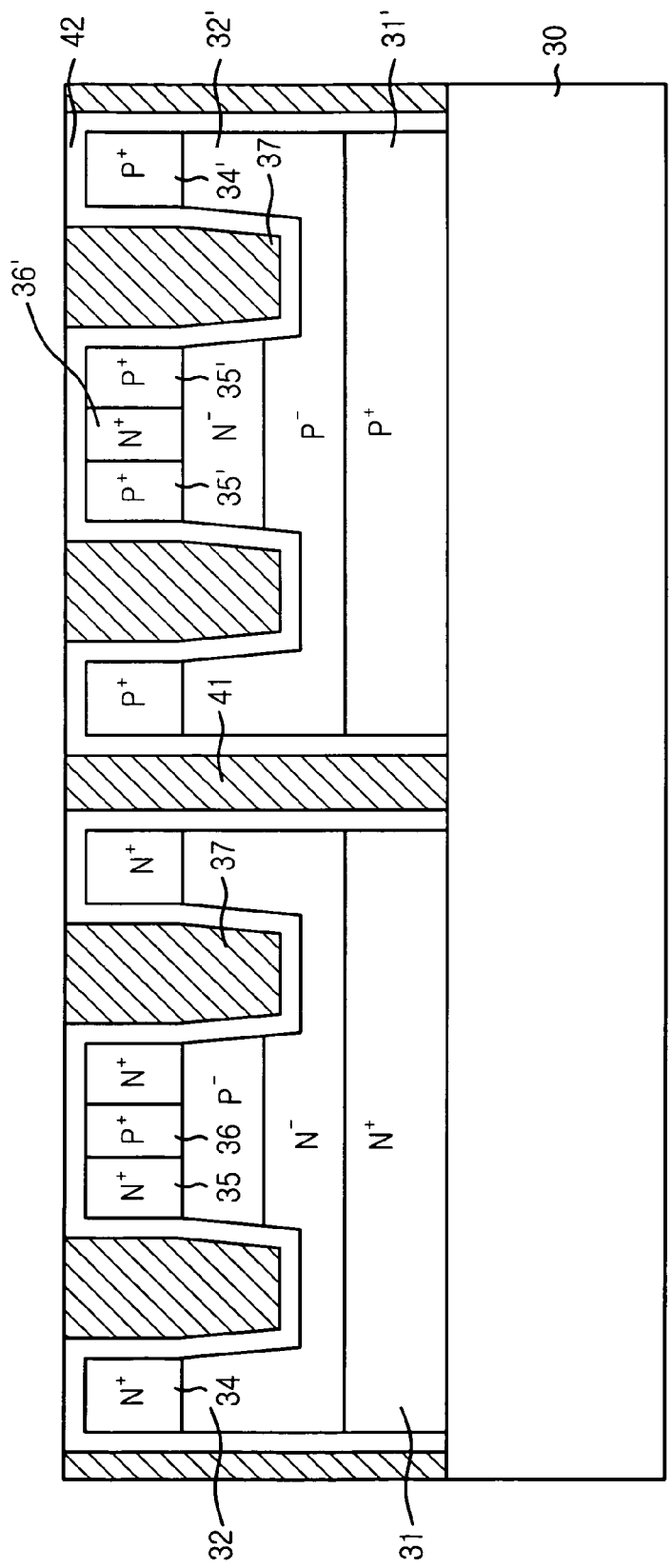

FIGS. 5A to 5Q are cross-sectional views illustrating a method for fabricating the high voltage transistor shown in FIG. 4 in accordance with the specific embodiment of the present invention.

Referring to FIG. 5A, a substrate SUB including a silicon layer 31A on an insulation layer 30 is provided.

Next, as shown in FIG. 5B, a first photoresist pattern 45 is formed on the silicon layer 31A and then, an NMOS region and a PMOS region are formed by patterning the silicon layer 31A by using the first photoresist pattern 45 as an etch mask. A reference numeral 46 denotes a first opening for a device isolation.

Next, as shown in FIG. 5C, a second photoresist pattern 47A for a drain of an NMOS transistor is formed on a predetermined portion of the silicon layer 31A. Afterwards, phosphorous is doped into the NMOS region by using the second photoresist pattern 47A as an etch mask, thereby forming an $N^+$-type drain junction region 31 for the NMOS transistor.

Continuously, the second photoresist pattern 47A is removed.

Next, as shown in FIG. 5D, a third photoresist pattern 47B for a drain of a PMOS transistor is formed on the insulation layer 30 and then, boron is doped into the PMOS region by using the third photoresist pattern 47B as an etch mask, thereby forming a $P^+$-type drain junction region 31' for the drain of the PMOS transistor.

Next, as shown in FIG. 5E, the third photoresist pattern 47B is removed.

As shown in FIG. 5F, silicon is deposited through an epitaxial method, thereby forming an $N^-$-type drain junction region 32 for the NMOS transistor and a $P^-$-type drain junction region 32' for the PMOS transistor.

A highly concentrated impurity doped on the $N^+$-type drain junction region 31 and the $P^+$-type drain junction region 31' ascends as the epitaxial method proceeds. Accordingly, drain junction profiles of the MOS transistors can be controlled without an additional process according to the thickness of a layer growing via the epitaxial method.

Subsequently, as shown in FIG. 5G, a fourth photoresist pattern 48A for a body region of the PMOS transistor is formed, and phosphorous is doped on the $P^-$-type drain junction region 32' for the PMOS transistor by using the fourth photoresist pattern 48A, thereby forming an $N^-$-type body region 33' for the PMOS transistor.

Continuously, the fourth photoresist pattern 48A is removed.

Next, as shown in FIG. 5H, a fifth photoresist pattern 48B for a body region of the NMOS transistor is formed. Then, boron is doped on the $N^-$-type drain junction region 32 by using the fifth photoresist pattern 48B, thereby forming a $P^-$-type body region 33 for the NMOS transistor.

Next, as shown in FIG. 5I, the fifth photoresist pattern 48B is removed.

Next, as shown in FIG. 5J, a sixth photoresist pattern 49 for forming gate patterns is formed on predetermined portions of the above resulting structure.

As shown in FIG. 5K, the $P^-$-type body region 33 and the $N^-$-type drain junction region 32 of the NMOS region and the $N^-$-type body region 33' and the $P^-$-type drain junction region 32' of the PMOS region are selectively removed by using the sixth photoresist pattern 49, thereby forming a plurality of second openings 50. At this time, both sidewalls of the individual second opening 50 in the NMOS region are bordered by the $P^-$-type body region 33 and the $N^-$-type drain junction region 32 and both sidewalls of the individual opening 50 in the PMOS region are bordered by the $N^-$-type body region 33' and the $P^-$-type drain junction region 32'.

Next, as shown in FIG. 5L, in the PMOS region and the NMOS region, a gate insulation layer 42 is formed over the second openings 50.

Next, as shown in FIG. 5M, a conductive layer 37A is formed over the gate insulation layer 42, filling the second openings 50.

As shown in FIG. 5N, a portion of the conductive layer 37A is selectively removed such that the conductive layer 37A remains only inside of the second openings 50. The conductive layer 37A remaining inside the second openings 50 is denoted with a reference numeral 37 and is referred as a gate insulation layer, hereinafter. A reference numeral 41 denotes the conductive layer 37A filled in a remaining portion except the second openings 50.

Subsequently, as shown in FIG. 5O, a seventh photoresist pattern 51A is formed. Then, phosphorous is doped into the PMOS region and the NMOS region by using the seventh photoresist pattern 51A as an etch mask, thereby forming a plurality of source regions 35 of the NMOS transistor, a plurality of drain regions 34 of the NMOS transistor and a source contact region 36' of the PMOS transistor.

Next, the seventh photoresist pattern 51A is removed.

As shown in FIG. 5P, an eighth photoresist pattern 51B is formed. Then, boron is doped into the PMOS region and the NMOS region by using the eighth photoresist pattern 51B as an etch mask, thereby forming a plurality of source regions 35' of the PMOS transistor, a plurality of drain regions 34' of the PMOS transistor and a source contact region 36 of the NMOS transistor.

As shown in FIG. 5Q, the eighth photoresist pattern 51B is removed.

As described above, the high voltage transistor in accordance with the present invention is formed on the front side, not the back side, of the substrate. Accordingly, it is now possible to embody the high voltage transistor that can be integrated into an integration circuit through a complementary metal oxide semiconductor (CMOS) fabrication process unlike the conventional high voltage transistor which was hard to be integrated to the integration circuit.

Since the high voltage transistor hard to be integrated into an integration circuit before now can be integrated into the integration circuit through the present invention, it is possible to greatly reduce a size of a semiconductor device using the high voltage transistor fabricated in accordance with the present invention compared with that of the conventional semiconductor device.

The present application contains subject matter related to the Korean patent application No. KR 2004-0071818, filed in the Korean Patent Office on Sep. 8, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a high voltage transistor, comprising:
    preparing a substrate including an insulation layer and a silicon layer formed on the insulation layer;
    patterning the silicon layer to definite a transistor region;
    forming a highly concentrated drain junction region of a first conductive type by implanting a first conductive type impurity to the transistor region;
    forming a drain junction region of the first conductive type on the highly concentrated drain junction region of the first conductive type by growing an epitaxial layer of the first conductive type;
    forming a body region of a second conductive type in a predetermined portion of the drain junction region of the first conductive type;
    forming a plurality of gate patterns in other predetermined portions of the drain junction region bordered by the body region of the second conductive type and the drain junction region of the first conductive type; and
    forming a plurality of highly concentrated drain regions of the first conductive type and a plurality of highly concentrated source regions of the first conductive type by implanting the first conductive type impurity to the drain junction region of the first conductive type and the body region of the second conductive type.

2. The method of claim 1, wherein the first conductive type impurity is an N-type impurity and the second conductive type impurity is a P-type impurity.

3. The method of claim 1, wherein the first conductive type impurity is a P-type impurity and the second conductive type impurity is an N-type impurity.

4. The method of claim 1, wherein the first conductive type impurity is phosphorous.

5. The method of claim 1, wherein the second conductive type impurity is boron.

6. The method of claim 1, further including forming a highly concentrated source contact region of the second conductive type surrounded by the highly concentrated source regions of the first conductive type by implanting the second conductive type impurity.

7. The method of claim 6, further including forming a source electrode contacted to the highly concentrated source contact region of the second conductive type.

8. The method of claim 7, further including forming a plurality of drain electrodes contacted to the highly concentrated drain regions of the first conductive type.

9. The method of claim 1, wherein the forming of the plurality of gate patterns includes:
    forming a plurality of trench type openings, each contacted to the body region of the second conductive type and the drain junction region of the first conductive type;
    forming a gate insulation layer over the openings;
    forming a conductive layer on the gate insulation layer filling the openings; and
    removing the conductive layer such that the conductive layer remains inside of the openings.

10. The method of claim 1, wherein the predetermined portions of the drain junction region of the first conductive type are formed in the shape of a trench.

* * * * *